(12) United States Patent
Hwang

(10) Patent No.: US 8,395,180 B2
(45) Date of Patent: Mar. 12, 2013

(54) LIGHT EMITTING DEVICE PACKAGE

(75) Inventor: Jung Ha Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 30 days.

(21) Appl. No.: 12/900,126

(22) Filed: Oct. 7, 2010

(65) Prior Publication Data

US 2011/0095329 A1 Apr. 28, 2011

(30) Foreign Application Priority Data

Oct. 22, 2009 (KR) .................. 10-2009-0100655

(51) Int. Cl.
*H01L 33/62* (2010.01)
*H01L 33/60* (2010.01)
*H01L 33/00* (2010.01)

(52) U.S. Cl. ............... 257/99; 257/98; 257/E33.061; 257/E33.066

(58) Field of Classification Search .................. None
See application file for complete search history.

(56) References Cited

U.S. PATENT DOCUMENTS

| | | | | |
|---|---|---|---|---|
| 5,176,310 A * | 1/1993 | Akiyama et al. | ............ | 228/180.5 |
| 6,468,821 B2 * | 10/2002 | Maeda et al. | .................... | 438/29 |
| 6,696,704 B1 * | 2/2004 | Maeda et al. | .................. | 257/98 |
| 6,874,910 B2 * | 4/2005 | Sugimoto et al. | ............. | 362/294 |
| 6,914,267 B2 * | 7/2005 | Fukasawa et al. | ............. | 257/98 |
| 7,023,019 B2 * | 4/2006 | Maeda et al. | .................. | 257/89 |
| 7,078,737 B2 * | 7/2006 | Yuri et al. | ........................ | 257/99 |
| 7,202,509 B2 * | 4/2007 | Nagai et al. | ...................... | 257/99 |
| 7,227,194 B2 * | 6/2007 | Ono | ................ | 257/99 |
| 7,301,175 B2 * | 11/2007 | Izuno et al. | ...................... | 257/98 |
| 7,390,684 B2 * | 6/2008 | Izuno et al. | ...................... | 438/29 |
| 7,592,639 B2 * | 9/2009 | Maeda et al. | ................... | 257/98 |
| 7,629,620 B2 * | 12/2009 | Maeda et al. | ................... | 257/98 |
| 7,658,866 B2 * | 2/2010 | Murazaki et al. | ...... | 252/301.4 R |
| 7,695,990 B2 * | 4/2010 | Sorg et al. | ........................ | 438/26 |
| 7,800,124 B2 * | 9/2010 | Urano et al. | ..................... | 257/98 |
| 7,910,939 B2 * | 3/2011 | Hanamoto et al. | .............. | 257/98 |
| 7,932,525 B2 * | 4/2011 | Osamu | .............. | 257/89 |
| 7,939,375 B2 * | 5/2011 | Lin et al. | ........................ | 438/118 |
| 7,989,838 B2 * | 8/2011 | Ku | .................. | 257/99 |
| 8,076,182 B2 * | 12/2011 | Lin et al. | ........................ | 438/118 |
| 8,138,663 B2 * | 3/2012 | Hamaguchi et al. | ........... | 313/358 |
| 8,193,556 B2 * | 6/2012 | Lin et al. | ......................... | 257/99 |
| 8,207,553 B2 * | 6/2012 | Lin et al. | ......................... | 257/99 |
| 8,212,279 B2 * | 7/2012 | Lin et al. | ......................... | 257/99 |

(Continued)

FOREIGN PATENT DOCUMENTS

| CN | 1476640 | 2/2004 |
|---|---|---|
| CN | 101329043 | 12/2008 |

(Continued)

*Primary Examiner* — Hoang-Quan Ho
(74) *Attorney, Agent, or Firm* — McKenna Long & Aldridge LLP

(57) ABSTRACT

Provided are a light emitting device package and a lighting system. The light emitting device package includes a light emitting device chip, at least one wire, and an encapsulating material. The light emitting device chip includes a first conductive type semiconductor layer, a second conductive type semiconductor layer on the first conductive type semiconductor layer, and an active layer between the first and second conductive type semiconductor layers. The wire is on the light emitting device chip. The encapsulating material is on the light emitting device chip out of the wire, and includes a phosphor. The wire is perpendicular to an upper surface of the light emitting device chip, at least up to a height of the encapsulating material.

8 Claims, 5 Drawing Sheets

U.S. PATENT DOCUMENTS

| | | | |
|---|---|---|---|
| 2001/0015443 A1* | 8/2001 | Komoto | 257/81 |
| 2004/0041159 A1* | 3/2004 | Yuri et al. | 257/79 |
| 2004/0061433 A1* | 4/2004 | Izuno et al. | 313/498 |
| 2004/0113168 A1* | 6/2004 | Eliashevich et al. | 257/99 |
| 2004/0164311 A1* | 8/2004 | Uemura | 257/99 |
| 2005/0045903 A1* | 3/2005 | Abe et al. | 257/100 |
| 2005/0093008 A1* | 5/2005 | Suehiro et al. | 257/98 |
| 2005/0224821 A1* | 10/2005 | Sakano et al. | 257/79 |
| 2006/0038187 A1* | 2/2006 | Ueno | 257/81 |
| 2006/0054912 A1* | 3/2006 | Murakami et al. | 257/99 |
| 2007/0012931 A1* | 1/2007 | Lee et al. | 257/89 |
| 2007/0034889 A1* | 2/2007 | Waitl et al. | 257/99 |
| 2007/0120234 A1* | 5/2007 | Kim et al. | 257/666 |
| 2007/0284598 A1* | 12/2007 | Shakuda et al. | 257/93 |
| 2008/0135862 A1* | 6/2008 | Maeda et al. | 257/98 |
| 2008/0191620 A1* | 8/2008 | Moriyama et al. | 313/506 |
| 2008/0231771 A1* | 9/2008 | Oishi | 349/62 |
| 2008/0293173 A1* | 11/2008 | Lee | 438/27 |
| 2008/0296609 A1 | 12/2008 | Nagahama et al. | |
| 2009/0166664 A1* | 7/2009 | Park et al. | 257/99 |
| 2009/0224268 A1* | 9/2009 | Tsuchiya | 257/88 |
| 2009/0236622 A1* | 9/2009 | Nishihara | 257/98 |
| 2009/0273004 A1* | 11/2009 | Lin et al. | 257/99 |
| 2009/0321779 A1* | 12/2009 | Kim et al. | 257/99 |
| 2010/0148211 A1* | 6/2010 | Sheu et al. | 257/99 |
| 2010/0163891 A1* | 7/2010 | Ku et al. | 257/88 |
| 2010/0200874 A1* | 8/2010 | Shioi et al. | 257/91 |
| 2010/0264444 A1* | 10/2010 | Ueno | 257/98 |
| 2011/0031523 A1* | 2/2011 | Ishii et al. | 257/98 |
| 2011/0062473 A1* | 3/2011 | Tanuma et al. | 257/98 |
| 2011/0096560 A1* | 4/2011 | Ryu et al. | 362/510 |
| 2011/0163322 A1* | 7/2011 | Yoo et al. | 257/76 |
| 2011/0180780 A1* | 7/2011 | Yoo et al. | 257/13 |
| 2011/0186901 A1* | 8/2011 | Ushiyama et al. | 257/99 |
| 2011/0186902 A1* | 8/2011 | Egoshi et al. | 257/99 |
| 2011/0210358 A1* | 9/2011 | Kim et al. | 257/98 |
| 2011/0278610 A1* | 11/2011 | Jeong et al. | 257/98 |
| 2012/0037882 A1* | 2/2012 | Yoo et al. | 257/13 |

FOREIGN PATENT DOCUMENTS

| | | | |
|---|---|---|---|
| JP | 07266617 A | * | 10/1995 |
| JP | 2006286999 | | 10/2006 |
| JP | 2007027281 A | * | 2/2007 |
| JP | 2008159671 A | * | 7/2008 |
| KR | 10-2004-0043839 | | 5/2004 |
| KR | 10-2006-0025724 | | 3/2006 |
| KR | 1020060025724 | | 3/2006 |
| KR | 100803730 | | 2/2008 |

* cited by examiner

LIGHT EMITTING DEVICE PACKAGE

This application claims the benefit of Korean Patent Application No. 10-2009-0100655 filed on Oct. 22, 2009, which is incorporated by reference in their entirety herein.

BACKGROUND

Embodiments relate to a light emitting device package and a lighting system.

In light emitting devices, P—N junction diodes having the properties of converting electrical energy into light energy may be formed by combining group III and V elements on the periodic table. Light emitting devices may implement various colors by controlling the composition ratio of compound semiconductors.

In light emitting devices, when a forward voltage is applied, an electron of an n-layer is combined with a hole of a p-layer to emit energy corresponding to an energy gap between the conduction band and the valance band. The energy is generally emitted in the form of heat or light. In light emitting devices, the energy is emitted in the form of light.

Nitride semiconductors, for example, are attracting much attention for the fields of optical devices and high-power electronic devices because of their high thermal stability and wide band gap energy. In particular, blue light emitting devices, green light emitting devices, and UV light emitting devices that use nitride semiconductors have been commercialized and are widely used.

To form a white light emitting device package, light emitting devices of red, green and blue, which are the three primary colors of light, may be combined, or a yellow phosphor such as yttrium aluminum garnet (YAG) and terbium aluminum garnet (TAG) as a phosphor may be added to a blue light emitting device, or a (red/green/blue) three-colored phosphor as a phosphor may be added to a UV light emitting device.

When a white light emitting device package includes an encapsulating material having a phosphor, the phosphor drops to the bottom of the light emitting device package as time elapses after molding, and thus, the phosphor may be distributed unevenly around a light emitting device chip, and color temperature may be widely distributed.

In addition, since a distribution area of a phosphor is larger than the area of a light emitting device, the phosphor may be distributed unevenly around the light emitting device, and color temperature may be widely distributed.

SUMMARY

Embodiments provide a light emitting device package having a uniform phosphor distribution, and a lighting system.

In one embodiment, a light emitting device package includes: a light emitting device chip comprising a first conductive type semiconductor layer, a second conductive type semiconductor layer on the first conductive type semiconductor layer, and an active layer between the first and second conductive type semiconductor layers; at least one wire on the light emitting device chip; and an encapsulating material on the light emitting device chip out of the wire, the encapsulating material comprising a phosphor, wherein the wire is perpendicular to an upper surface of the light emitting device chip, at least up to a height of the encapsulating material.

In another embodiment, a light emitting device package includes: a plurality of wires on the light emitting device chip; and an encapsulating material on the light emitting device chip between the wires, the encapsulating material comprising a phosphor, wherein the wire comprises at least one dummy wire.

In further another embodiment, a light emitting device package includes: a light emitting device chip comprising a first conductive type semiconductor layer, a second conductive type semiconductor layer on the first conductive type semiconductor layer, and an active layer between the first and second conductive type semiconductor layers; at least one wire on the light emitting device chip; and an encapsulating material on the light emitting device chip out of the wire, the encapsulating material comprising a phosphor, wherein the wire is in contact with an outermost part of the light emitting device chip.

In still further another embodiment, a lighting system includes a light emitting module including a substrate and a light emitting device package on the substrate.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device package and a lighting system will be described with reference to accompanying drawings according to embodiments.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

EMBODIMENTS

Figure 1:
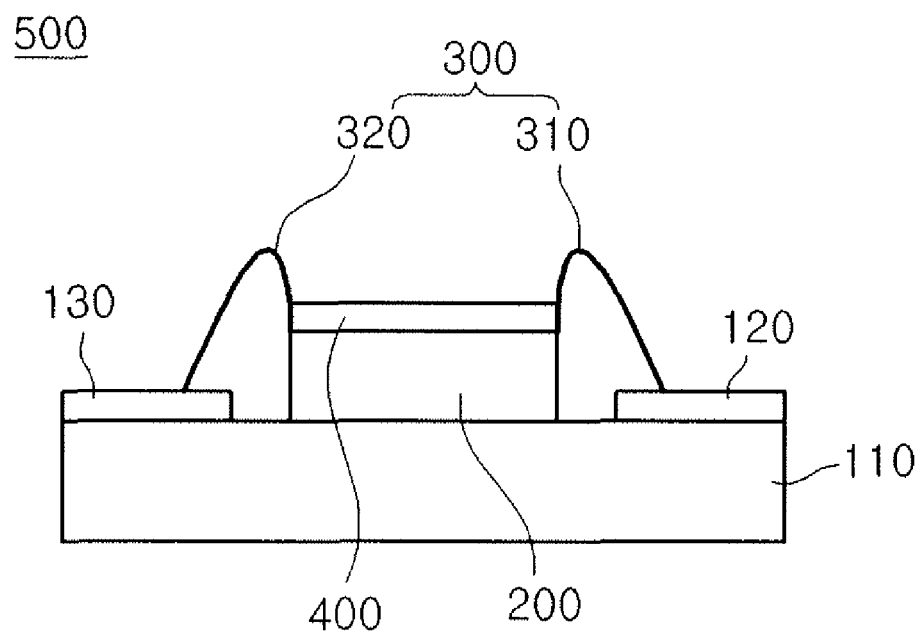
FIG. 1 is a cross-sectional view of a light emitting device package according to a first embodiment.

FIG. 1 is a cross-sectional view of a light emitting device package 500 according to a first embodiment.

The light emitting device package 500 may include a light emitting device chip 200, one or more wires 300 disposed on the light emitting device chip 200, and an encapsulating material 400 including a phosphor (not shown) and disposed on the light emitting device chip 200 between the wires 300. The light emitting device chip 200 may be disposed on a submount 110.

In the embodiment, the upper surface of the encapsulating material 400 may be flat, and thus, surface light may be emitted, thereby facilitating optical design. Alternatively, the encapsulating material 400 may have a concavo-convex upper surface (not shown), thereby improving light extraction efficiency.

The encapsulating material 400 has a height that is equal to or less than the height of the wires 300, where the wires 300 may be disposed around the outermost portion of the light emitting device chip 200 and oriented perpendicular to the upper surface of the light emitting device chip 200. The relative height of the wires 300 compared to the height of the encapsulating material 400, the perpendicular orientation of the wires 300, the positioning of the wires 300 around the outermost portion of the light emitting device chip 200, and the inherent surface tension of the encapsulating material 400 help to contain the encapsulating material on the surface of the light emitting device chip 200 and facilitate the uniformity of the encapsulating material 400. This, in turn, improves light emitting efficiency.

Thus, according to the embodiment, the encapsulating material including the phosphor is disposed on the light emitting device chip 200 between the wires 300, and thus, the phosphor is uniformly disposed around the light emitting device chip, and narrow color temperature distribution is achieved.

Figure 2:
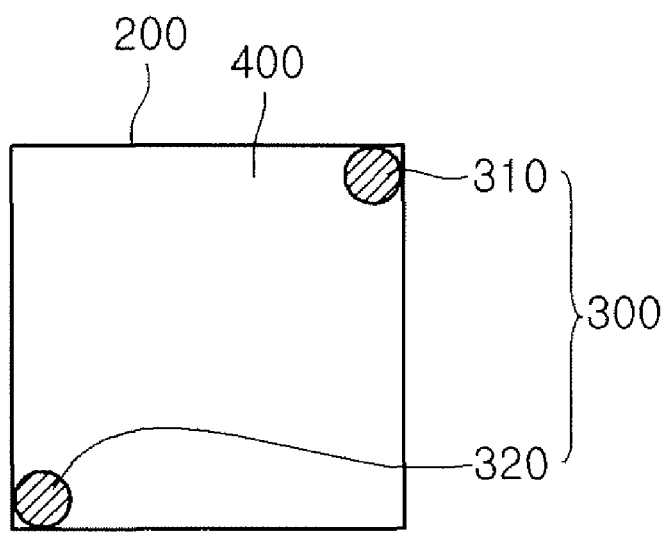
FIG. 2 is a partial plan view illustrating the light emitting device package according to the first embodiment.

FIG. 2 is a partial plan view illustrating the upper end of the light emitting device chip of the light emitting device package according to the first embodiment.

According to the first embodiment, the wires 300 may includes a first wire 310 and a second wire 320, which may be connected to actual pads. The chip illustrated in FIG. 2 is a horizontal light emitting device chip, but the present disclosure is not limited thereto.

Figure 3:
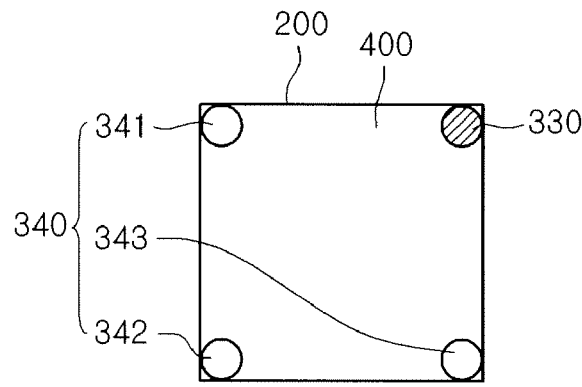
FIGS. 3 to 5 are partial plan views illustrating light emitting device packages according to second to fourth embodiments.
Figure 4:
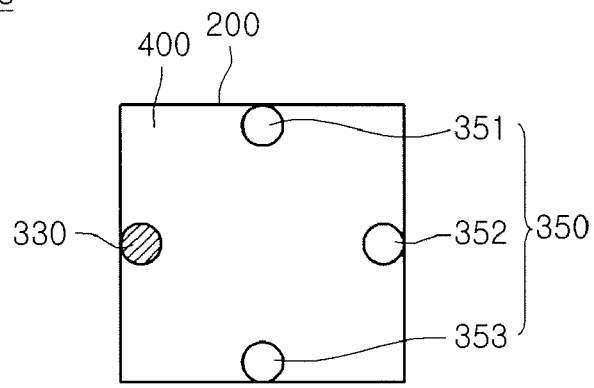
Figure 5:
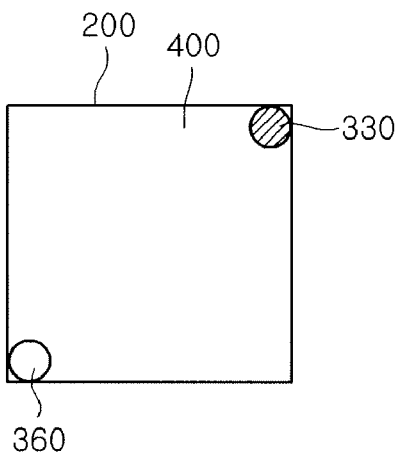

FIGS. 3 to 5 are partial plan views illustrating light emitting device packages according to second to fifth embodiments.

According to the second to fourth embodiments, the wires may include one or more dummy wires 340. For example, the wires may include a real wire 330 disposed on an actual pad (not shown), and dummy wires 340 including first to third dummy wires 341, 342, and 343. The second embodiment may be applied to a vertical light emitting device chip, but the present disclosure is not limited thereto.

FIG. 3 is a partial plan view illustrating a light emitting device package 500b according to the second embodiment. Wires are disposed at upper corners of a light emitting device chip, but the present disclosure is not limited thereto. FIG. 4 is a partial plan view illustrating a light emitting device package 500c according to the third embodiment. The real wire 330 and dummy wires 350 including first to third dummy wires 351, 352, and 353 may be disposed out of the corners of a light emitting device chip. FIG. 5 is a partial plan view illustrating a light emitting device package 500d according to the fourth embodiment. A dummy wire 360 is provided, but the present disclosure is not limited thereto. In each of FIGS. 3 to 5, each of the wires is positioned such that it is opposite a corresponding one of the other wires.

According to the embodiment, the encapsulating material including the phosphor is disposed on the light emitting device chip 200 between the wires 300, and thus, the phosphor is uniformly disposed around the light emitting device chip, and narrow color temperature distribution is achieved.

Hereinafter, a method of manufacturing a light emitting device package will be described with reference to FIGS. 6 to 8 according to an embodiment.

Figure 6:
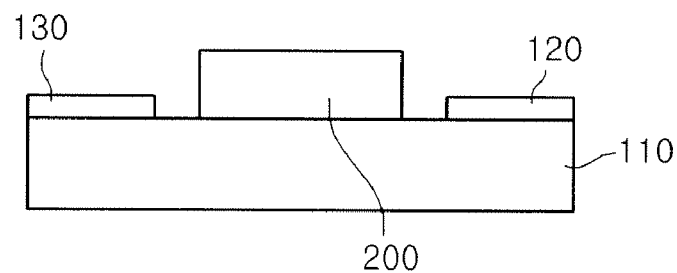
FIGS. 6 to 8 are cross-sectional views illustrating a method of manufacturing the light emitting device package according to the first embodiment.

First, referring to FIG. 6, the submount 110 is prepared.

The submount 110 may have a thermal expansion coefficient that is similar to that of a material of a light emitting device chip, and high heat conductivity. For example, in the embodiment, the submount 110 may be formed of silicon (Si), but the present disclosure is not limited thereto.

The submount 110 may include a reflector cup (not shown), and a Zener diode type electrostatic discharge (ESD) prevention device may be disposed in the submount 110.

A first lead frame 120 and a second lead frame 130 may be formed on the submount 110, but the present disclosure is not limited to the number and type thereof. At least one of the first and second lead frames 120 and 130 may be a dummy lead frame. The lead frame may be electrically insulated from the submount 110.

Next, the light emitting device chip 200 is attached onto the submount 110.

The light emitting device chip 200 may be formed of a material such as GaN, GaAs, GaAsP, or GaP. For example, a Green-Blue LED may be formed of GaN (InGaN), and a Yellow-Red LED may be formed of InGaAlP or AlGaAs, but the present disclosure is not limited thereto.

The light emitting device chip 200 may include a first conductive type semiconductor layer (not shown), an active layer (not shown), and a second conductive type semiconductor layer (not shown), but the present disclosure is not limited thereto.

The light emitting structure may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HVPE), but the present disclosure is not limited thereto.

The first conductive type semiconductor layer may be formed of group III-V compound semiconductor that is doped with a first conductive type dopant. When the first conductive type semiconductor layer is an N type semiconductor layer, the first conductive type dopant may include Si, Ge, Sn, Se, or Te as an N type dopant, but the present disclosure is not limited thereto.

The first conductive type semiconductor layer may include a semiconductor material having a composition equation of $In_xAl_yGa_{1-x-y}N$ ($0 \leq x \leq 1$, $0 \leq y \leq 1$, $0 \leq x+y \leq 1$). The first conductive type semiconductor layer may include at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer may have at least one of a single quantum well structure, a multi quantum well (MQW) structure, a quantum-wire structure, and a quantum dot structure. For example, the active layer may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

The second conductive type semiconductor layer may include group III-V compound semiconductor that is doped with a second conductive type dopant, e.g., include a semiconductor material having a composition equation of $In_xAl_yGa_{1-x-y}N$ ($0 \leq x \leq 1$, $0 \leq y \leq 1$, $0 \leq x+y \leq 1$). For example, the second conductive type semiconductor layer may include GaN, AlN, AlGaN, InGaN, InN, InAlGaN, AlInN, AlGaAs, GaP, GaAs, GaAsP, or AlGaInP. When the second conductive type semiconductor layer is a P type semiconductor layer, the second conductive type dopant may include Mg, Zn, Ca, Sr, or Ba as a P type dopant.

In the embodiment, the first conductive type semiconductor layer is an N type semiconductor layer, and the second conductive type semiconductor layer is a P type semiconductor layer, but the present disclosure is not limited thereto. A layer of an opposite conductive type semiconductor to the second conductive type semiconductor, e.g., of an N type semiconductor layer (not shown) may be formed on the second conductive type semiconductor layer. Accordingly, the light emitting structure may have one of an N—P junction structure, a P—N junction structure, an N—P—N junction structure and a P—N—P junction structure. The light emitting device chip 200 illustrated in FIG. 6 may be a vertical or horizontal light emitting device chip, but the present disclosure is not limited thereto.

For example, when the light emitting device chip 200 is a vertical chip, the light emitting device chip 200 may include a light emitting structure disposed on a second electrode (not shown). The second electrode may include at least one of an ohmic layer, a reflective layer, a coupling layer, and a conductive substrate. The light emitting structure may include a second conductive type semiconductor layer, an active layer, and a first conductive type semiconductor layer.

Next, the light emitting device chip 200 may be attached to the submount 110 using a method using a polymer adhesive or a eutectic metal used for plating a light emitting device chip.

For example, a light emitting device chip may be attached through a soldering process using Ag conductive epoxy having improved process or a eutectic bonding process in the case where high heat conductivity is required, but is not limited thereto.

Figure 7:
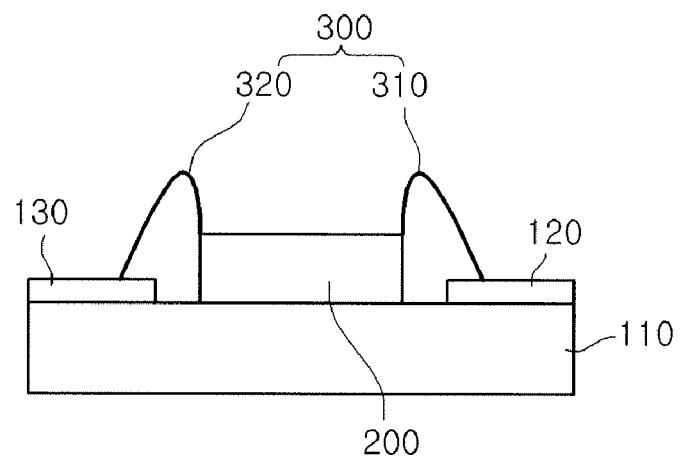

Next, referring to FIG. 7, a wire bonding process may be performed to apply a current to the light emitting device chip 200. For example, a single wire bonding process may be performed for a vertical type light emitting device chip, and two wire bonding process may be performed for a horizontal type light emitting device chip. The wire may include at least one of a gold wire, a copper wire, and an aluminum wire, and the wire bonding may include a ball wire bonding or edge wire bonding.

According to the first embodiment, the wires 300 may includes the first wire 310 and the second wire 320, which may be connected to actual pads.

Referring to FIGS. 3 to 5, in the light emitting device package according to the second embodiment, the wires may include one or more dummy wires 340, 350, and 360. For example, the wires may include the real wire 330 disposed on an actual pad (not shown), and the dummy wires 340 including the first to third dummy wires 341, 342, and 343.

According to the embodiment, the encapsulating material including the phosphor is disposed on the light emitting device chip 200 between the wires 300, and thus, the phosphor is uniformly disposed around the light emitting device chip, and narrow color temperature distribution is achieved.

Figure 8:
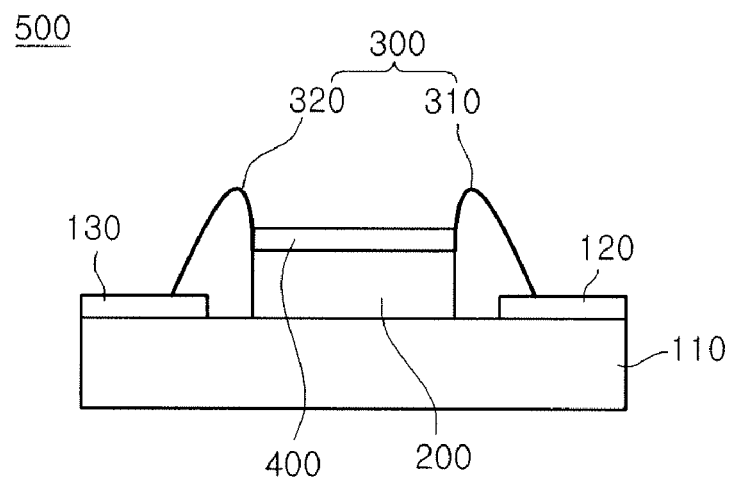

Next, referring to FIG. 8, the encapsulating material 400 including the phosphor is formed on the light emitting device chip 200 between the wires 300.

For example, the encapsulating material 400 including a phosphor (not shown) is formed on the light emitting device chip 200 to protect the light emitting device chip 200 and increase the light extraction efficiency.

The encapsulating material 400 has a height that is equal to or less than the height of the wires 300, and the wires 300 may be disposed around the light emitting device chip 200.

Thus, according to the embodiment, the encapsulating material including the phosphor is disposed on the light emitting device chip 200 between the wires 300, and thus, the phosphor is uniformly disposed around the light emitting device chip, and narrow color temperature distribution is achieved.

The encapsulating material 400 may be an epoxy encapsulating material or a silicon encapsulating material, but the present disclosure is not limited thereto.

In the embodiment, the light emitting device chip may include a Green-Blue LED, a Yellow-Red LED, or a UV LED, and may form white light by adding a phosphor to an encapsulating material.

For example, in the embodiment, a yellow phosphor such as yttrium aluminum garnet (YAG) and terbium aluminum garnet (TAG) as a phosphor may be added to a blue light emitting device, or a (red/green/blue) three-colored phosphor as a phosphor may be added to a UV LED, but the present disclosure is not limited thereto.

The phosphor may include a host material and an active material. For example, yttrium aluminum garnet (YAG) as a host material and a cerium (Ce) active material, or a silicate based host material and a europium (Eu) active material may be used, but the present disclosure is not limited thereto.

The encapsulating process may be performed in a sequence of composition, mixing, discharging, and curing. Encapsulating method using the encapsulating material include methods such as dispensing, casting molding, transfer molding, vacuum printing, screen printing.

The upper surface of the encapsulating material 400 may be flat, but the present disclosure is not limited thereto. The encapsulating material 400 is disposed in a plane uniformly on the light emitting device chip 200, and thus, the phosphor is uniformly disposed around the light emitting device chip. Surface light may be emitted to facilitate optical design.

In the embodiment, the encapsulating material may have a concavo-convex upper surface (not shown), thereby improving light extraction efficiency. For example, a wet etching process may be partially performed after the encapsulating process to form a concavo-convex surface on the upper surface of the encapsulating material 400. Alternatively, transfer molding using a mold having a concavo-convex surface is performed to form a concavo-convex surface on the upper surface of the encapsulating material.

Thereafter, a hemisphere shaped outer lens may be formed on the encapsulating material 400 to enhance light extraction effect and protect a wire (not shown).

Thus, according to the embodiment, the encapsulating material including the phosphor is disposed on the light emitting device chip between the wires, and thus, the phosphor is uniformly disposed around the light emitting device chip, and narrow color temperature distribution is achieved.

The light emitting device package according to the embodiment may be arrayed in plurality on a substrate, and a light guide panel, a prism sheet, a spread sheet, and a fluorescent sheet may be disposed as an optical member on the path of light emitted from the light emitting device package. The light emitting device package, the substrate, and the optical member function as a backlight unit or a lighting unit. For example, lighting systems may include a backlight unit, a lighting unit, an indicator, a lamp, and a road lamp.

Figure 9:
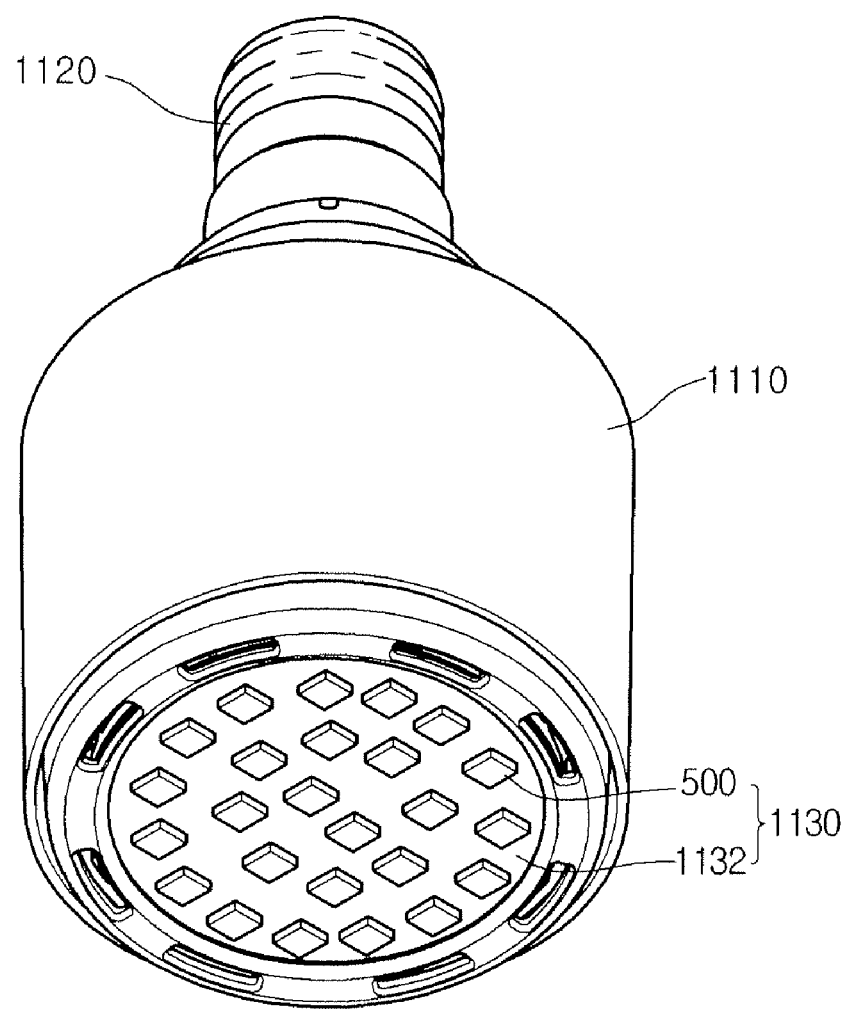
FIG. 9 is a perspective view of a lighting unit according to an embodiment.

FIG. 9 is a perspective view of a lighting unit 1100 according to an embodiment. The lighting unit 1100 is an example of a lighting system, but the present disclosure is not limited thereto.

Referring to FIG. 9, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one LIGHT EMITTING DEVICE package 500 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 500 may be mounted on the substrate 1132. The light emitting device package 500 may include at least one the light emitting device chip 200.

The light emitting device package 500 is not limited to the first embodiment, and thus, may include the light emitting device package 500*b*, 500*c*, or 500*d* according to the second to fourth embodiments.

The light emitting module 1130 may include a plurality of light emitting device packages 500 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. As shown in FIG. 9, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 10:
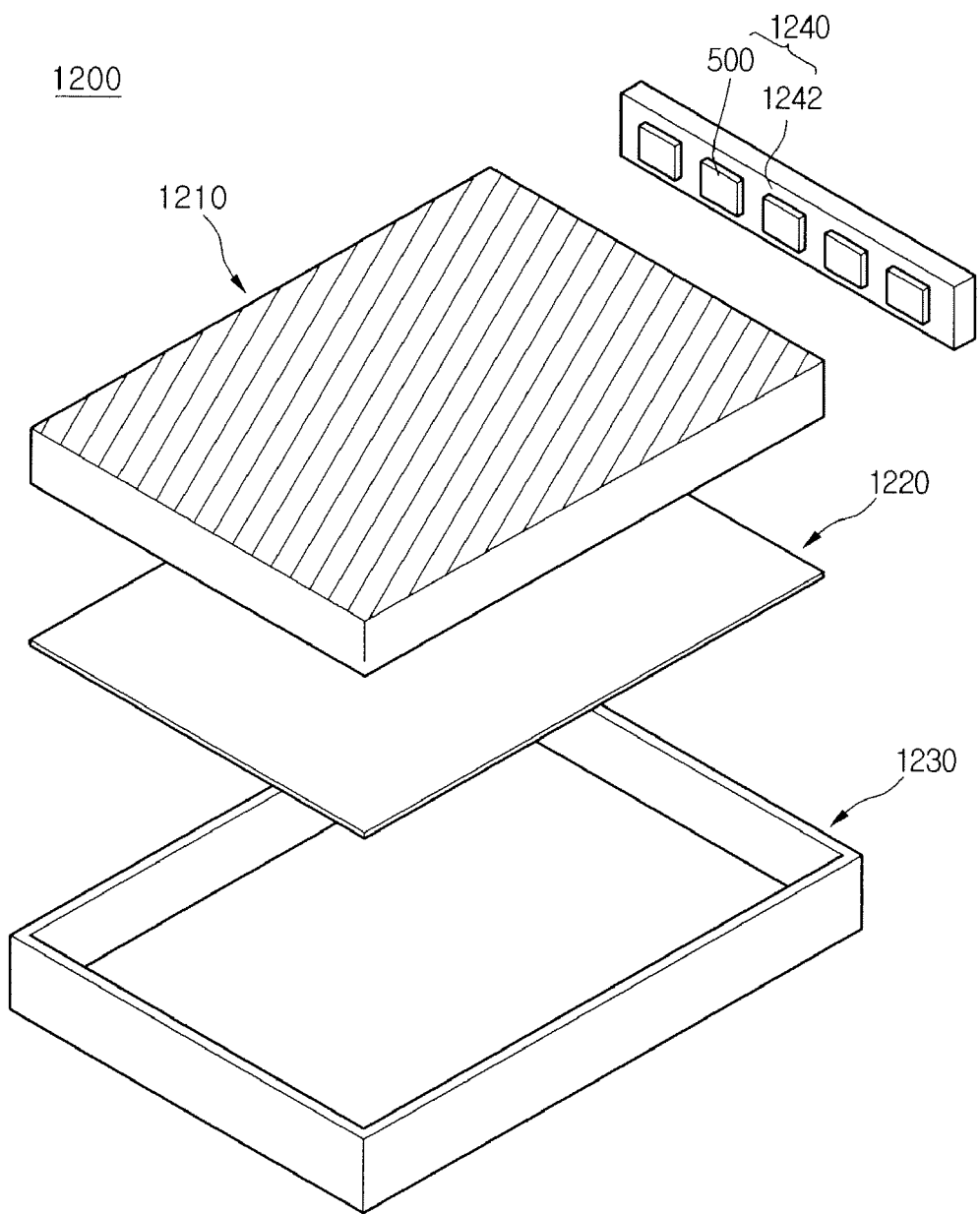
FIG. 10 is an exploded perspective view of a backlight unit according to an embodiment.

FIG. 10 is an exploded perspective view of a backlight unit 1200 according to an embodiment. The lighting unit 1200 is an example of a lighting system, but the present disclosure is not limited thereto.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of LIGHT EMITTING DEVICE packages 500 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The plurality of light emitting device packages 500 may be disposed on the substrate 1242, and each light emitting surface thereof may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

As described above, the lighting system according to the embodiments includes the light emitting device packages according to the embodiments, thereby improving reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a light emitting device chip comprising a first conductive type semiconductor layer, a second conductive type semiconductor layer on the first conductive type semiconductor layer, and an active layer between the first and the second conductive type semiconductor layers;
    at least two wires attached to and projecting from an upper surface of the light emitting device chip; and
    an encapsulating material on the light emitting device chip, wherein the encapsulating material comprises a phosphor, and wherein the height of an upper surface of the encapsulating material equal to or less than the height of the at least two wires, wherein the encapsulating material comprising the phosphor is disposed only between the at least two wires,
wherein at least two wires comprise at least one real wire and at least one dummy wire, and
wherein the real wire is electrically connected to the light emitting device chip and the dummy wire is not electrically connected to the light emitting device chip.

2. The light emitting device package of claim 1, wherein the upper surfaced of the encapsulating material is substantially flat.

3. The light emitting device package of claim 1, wherein the at least two wires are disposed around the light emitting device chip.

4. The light emitting device package of claim 3, wherein the at least two wires are in contact with a peripheral portion of the light emitting device chip.

5. The light emitting device package of claim 1, wherein the at least two wires are disposed around the light emitting device chip, and wherein each of the at least two wires is positioned opposite a corresponding one of the other wires.

6. The light emitting device package of claim 1, wherein each of the at least two wires is substantially perpendicular to the upper surface of the light emitting device chip.

7. The light emitting device package of claim 1, wherein the at least two wires are in contact with an outermost part of the light emitting device chip.

8. The light emitting device package of claim 7, wherein the at least one wire are perpendicular to the upper surface of the light emitting device chip.

* * * * *